US010770317B2

(12) United States Patent
Tustaniwskyj

(10) Patent No.: US 10,770,317 B2
(45) Date of Patent: Sep. 8, 2020

(54) LEAK TOLERANT LIQUID COOLING SYSTEM EMPLOYING IMPROVED AIR PURGING MECHANISM

(71) Applicant: Delta Design, Inc., Poway, CA (US)

(72) Inventor: Jerry Ihor Tustaniwskyj, Mission Viejo, CA (US)

(73) Assignee: DELTA DESIGN, INC., Poway, CA (US)

( * ) Notice: Subject to any disclaimer, the term of this patent is extended or adjusted under 35 U.S.C. 154(b) by 787 days.

(21) Appl. No.: 15/191,615

(22) Filed: Jun. 24, 2016

(65) Prior Publication Data

US 2016/0379852 A1    Dec. 29, 2016

Related U.S. Application Data

(60) Provisional application No. 62/185,250, filed on Jun. 26, 2015.

(51) Int. Cl.
*H05K 7/20* (2006.01)
*H01L 21/67* (2006.01)

(52) U.S. Cl.
CPC ... *H01L 21/67109* (2013.01); *H05K 7/20272* (2013.01)

(58) Field of Classification Search
CPC ............. H05K 7/20272; H05K 7/20; H01L 21/67109; H01L 23/473; H01L 21/67;
(Continued)

(56) References Cited

U.S. PATENT DOCUMENTS 3,620,297 A * 11/1971 Orville Adkins .... B60H 1/3202
165/44
4,698,728 A   10/1987 Tustaniwskyj et al.
(Continued)

FOREIGN PATENT DOCUMENTS

| CN | 103157345 A | 6/2013 |
|---|---|---|
| CN | 103594136 A | 2/2014 |
| CN | 104703444 A | 6/2015 |

OTHER PUBLICATIONS

International Search Report and Written Opinion dated Oct. 5, 2016 in PCT/US2016/039163 (11 pgs.)
(Continued)

*Primary Examiner* — Travis C Ruby
*Assistant Examiner* — Harry E Arant
(74) *Attorney, Agent, or Firm* — Foley & Lardner LLP

(57) ABSTRACT

A cooling system for at least one thermal unit includes a tank assembly that includes: a sump chamber, a purge chamber that is located above the sump chamber, and a reservoir chamber that is located above the purge chamber; a cooling circuit that includes a pump, a heat exchanger, and conduits, the cooling circuit being configured to circulate a liquid coolant through the at least one thermal unit, the sump chamber, the pump, the heat exchanger, and the reservoir chamber; a first valve located externally of the tank assembly and configured such that, when the first valve is open, (i) the liquid coolant is flowable from the purge chamber to the sump chamber via the first valve, and (ii) air is simultaneously flowable from the sump chamber to the purge chamber via the first valve; and a second valve located externally of the tank assembly and configured such that, when the second valve is open, (i) the liquid coolant is flowable from the reservoir chamber to the purge chamber via the second (Continued)

valve, and (ii) air is simultaneously flowable from the purge chamber to the reservoir chamber via the second valve.

21 Claims, 2 Drawing Sheets

(58) Field of Classification Search
CPC ......... Y10S 165/917; Y10T 137/86228; F24D 19/08; F24D 19/083
USPC .................................................. 165/104.32
See application file for complete search history.

(56) References Cited

U.S. PATENT DOCUMENTS

| | | |
|---|---|---|
| 4,967,832 A | 11/1990 | Porter |
| 5,048,599 A * | 9/1991 | Tustaniwskyj ........ F24D 19/083 165/104.32 |
| 7,508,665 B1 * | 3/2009 | Palmer ................. H05K 7/2079 361/696 |
| 9,167,721 B2 * | 10/2015 | Campbell ........... H05K 7/20281 |
| 2005/0211426 A1 * | 9/2005 | Ziarnik .................... G06F 1/206 165/287 |
| 2007/0193721 A1 * | 8/2007 | Tilton ..................... F25B 43/04 165/104.19 |
| 2008/0311466 A1 * | 12/2008 | Yang .................... H01M 10/486 429/62 |
| 2013/0138253 A1 * | 5/2013 | Chainer ............... G05D 7/0635 700/282 |
| 2014/0144328 A1 * | 5/2014 | Greene, Jr. ............. C12C 13/10 99/276 |
| 2016/0065104 A1 * | 3/2016 | Gauthier ............. H02P 7/2913 388/811 |

OTHER PUBLICATIONS

Office Action issued in Chinese Application No. 201680043425.8 dated Mar. 27, 2019 with translation (9 pages).

* cited by examiner

LEAK TOLERANT LIQUID COOLING SYSTEM EMPLOYING IMPROVED AIR PURGING MECHANISM

CROSS-REFERENCE TO RELATED APPLICATIONS

This application claims priority to U.S. Provisional Application No. 62/185,250, filed Jun. 26, 2015, which is hereby incorporated by reference in its entirety.

BACKGROUND OF THE INVENTION

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

The present disclosure relates generally to leak tolerant liquid cooling systems for electrical components.

In the prior art, such liquid cooling systems are described in U.S. Pat. No. 4,698,728 ("the '728 patent") and U.S. Pat. No. 5,048,599 ("the '599 patent"), which are hereby incorporated by reference for all their teachings relating to leak tolerant liquid cooling systems for electrical components.

In the '728 patent, a liquid coolant is directed past the electrical components via certain conduits at sub-atmospheric pressure. Since the pressure of the liquid inside of the conduits is less than the pressure of the atmosphere outside the conduits, air gets sucked into the conduits if they develop a leak. Consequently, none of the liquid coolant is spilled. However, after the air gets into the conduits, it must somehow be purged from them. Otherwise, if the air is allowed to remain entrained in the coolant, the rate at which the coolant moves through the system would be reduced which in turn would reduce the systems cooling ability. Additionally, accumulation of air in the system can cause a coolant reservoir of the system to overflow. Further, the air could get trapped in certain critical passages of the cooling system, such as passages in a cooling jacket around the electrical components, which in turn would cause hot spots in the cooling system.

In the '728 patent, a mechanism by which air is removed from the coolant is illustrated and described in conjunction with FIGS. 2a-2d. However, with that mechanism, a pump which circulates the liquid coolant through the conduits must be temporarily turned off and then turned back on in order to perform the air purging operation. Such an interruption in the operation of the pump may temporarily lower the rate at which the coolant flows through the system, which in turn lowers the rate at which the electrical components are cooled. In addition, switching the pump from off to on produces pressure surges throughout the cooling circuit, and that in turn stresses the cooling circuit components and their joints. Further, switching the pump from off to on produces a step like increase in electrical power which is drawn from the cooling system's power supply. Thus, the power supply must include compensation to insure that harmful transients do not occur in any supply voltages to the electrical components that are being cooled.

The '599 patent describes one solution to this issue. In the system described therein, a leak tolerant liquid cooling system for electrical components includes a cooling circuit which contains a pump and conduits that circulate a liquid coolant past the electrical components and through the bottom chamber of a purge tank. This purge tank also has a top chamber which is connected to the bottom chamber through a passageway; and, the bottom chamber is sized such that the liquid coolant passes through it with a velocity which is low enough to let any air bubbles in the coolant rise and move by buoyancy through the passageway into the top chamber. Also, the top chamber has an input port and an output port with respective valves. Air is purged from the top chamber through the output port by forcing liquid coolant into the top chamber from a reservoir via the input port. As this occurs, the coolant continues to be pumped past the electrical components through the coolant circuit. Thus, the pressures throughout the cooling circuit remains constant, and the supply voltages to the electrical components remain constant. Also, to purge air from the top chamber quickly, the passageway between the purge tank chambers is constricted in a way which hinders the flow of coolant from the top chamber to the bottom chamber while the coolant is being forced into the top chamber.

However, in the system of the '599 patent, there are valves and/or orifices that are internal to the purge tank and/or the reservoir. Therefore, the reservoir and the purge tank require disassembly to allow for repair and/or replacement of the valves and/or orifices. Further, if there are different thermal units, it may be necessary to have a different orifice size for optimal performance.

SUMMARY OF THE INVENTION

Certain embodiments of the present invention have been developed in view of the above-mentioned problems with existing leak tolerant liquid cooling system for electrical components.

In one embodiment, a cooling system for at least one thermal unit includes a tank assembly that includes: a sump chamber, a purge chamber that is located above the sump chamber, and a reservoir chamber that is located above the purge chamber; a cooling circuit that includes a pump, a heat exchanger, and conduits, the cooling circuit being configured to circulate a liquid coolant through the at least one thermal unit, the sump chamber, the pump, the heat exchanger, and the reservoir chamber; a first valve located externally of the tank assembly and configured such that, when the first valve is open, (i) the liquid coolant is flowable from the purge chamber to the sump chamber via the first valve, and (ii) air is simultaneously flowable from the sump chamber to the purge chamber via the first valve; and a second valve located externally of the tank assembly and configured such that, when the second valve is open, (i) the liquid coolant is flowable from the reservoir chamber to the purge chamber via the second valve, and (ii) air is simultaneously flowable from the purge chamber to the reservoir chamber via the second valve.

In one aspect, the sump chamber and the purge chamber are separated by a first wall, the purge chamber and the reservoir chamber are separated by a second wall, and the first wall and the second wall are each made of a continuous sheet of material with no valves or openings extending therethrough.

In one aspect, which is combinable with any of the above embodiments and aspects, the cooling circuit further comprises a filter located at a location in the cooling circuit between the pump and the reservoir chamber.

In one aspect, which is combinable with any of the above embodiments and aspects, during normal operation of the system, the first valve is open and the second valve is closed.

In one aspect, which is combinable with any of the above embodiments and aspects, when no power is supplied to the first and second valves, the first and second valves are open.

In one aspect, which is combinable with any of the above embodiments and aspects, the at least one thermal unit is located above a normal fluid level of the reservoir chamber.

In one aspect, which is combinable with any of the above embodiments and aspects, during normal operation of the system, the sump chamber, the purge chamber, and the portion of the cooling circuit at the at least one thermal unit are at negative pressure, while the reservoir chamber is at atmospheric pressure or above.

In one aspect, which is combinable with any of the above embodiments and aspects, the system is configured such that, if a leak develops in the cooling circuit, air that enters the sump chamber slows down and rises through the first valve to the purge chamber, while coolant in the purge chamber simultaneously passes through the first valve to the sump chamber.

In one aspect, which is combinable with any of the above embodiments and aspects, the cooling system further comprises a sensor in communication with the reservoir chamber and configured to provide an output signal indicating when the coolant in the reservoir chamber has dropped to a predetermined level.

In one aspect, which is combinable with any of the above embodiments and aspects, the system is configured such that, when the output signal indicates that the coolant in the purge chamber has dropped to a predetermined level, the first valve closes and the second valve opens, such that coolant passes from the reservoir chamber through the second valve into the purge chamber, while air simultaneously passes from the purge chamber through the second valve into the reservoir chamber.

In one aspect, which is combinable with any of the above embodiments and aspects, the cooling system further comprises an S-bubble airlock located externally of the tank assembly and configured to allow the reservoir chamber to remain at atmospheric pressure.

In one aspect, which is combinable with any of the above embodiments and aspects, the S-bubble airlock is configured to seal the reservoir chamber from the outside environment, but allows the reservoir chamber to remain at atmospheric pressure.

In one aspect, which is combinable with any of the above embodiments and aspects, the S-bubble airlock contains a fluid that includes a biocide.

In one aspect, which is combinable with any of the above embodiments and aspects, a fixed pulse-width modulation (PWM) is used to control a speed of a cooling fan of the heat exchanger.

In one aspect, which is combinable with any of the above embodiments and aspects, a temperature of coolant provided to the at least one thermal unit is monitored by a temperature sensor, and controlled to a given set point by varying a speed of a cooling fan of the heat exchanger based on the sensed temperature.

In one aspect, which is combinable with any of the above embodiments and aspects, a power usage of a heater of the at least one thermal unit is monitored, and a temperature of coolant provided to the at least one thermal unit is controlled by varying a speed of a cooling fan of the heat exchanger based on the monitored heater power usage.

In one aspect, which is combinable with any of the above embodiments and aspects, the cooling system further comprises at least one pressure relief valve located between at least one conduit leading to the at least one thermal unit and at least one conduit leading from the at least one thermal unit, in parallel with the at least one thermal unit, the pressure relief valve being configured to allow a flow of coolant therethrough when a pressure in the conduit leading to the at least one thermal unit exceeds a predetermined threshold value.

In one aspect, which is combinable with any of the above embodiments and aspects, the cooling system further comprises a temperature sensor configured to measure a temperature of coolant in the reservoir chamber.

In one aspect, which is combinable with any of the above embodiments and aspects, the cooling system further comprises a differential pressure sensor located between a conduit leading to the heat exchanger and a conduit leading from the heat exchanger.

In one aspect, which is combinable with any of the above embodiments and aspects, the cooling system further comprises a third valve located between (i) a conduit located between the pump and the reservoir chamber and (ii) the purge chamber, wherein the system is configured such that, when the output signal indicates that the coolant in the reservoir chamber has dropped to a predetermined level, the third valve opens, such that coolant is pumped to the purge chamber by the pump.

In one aspect, which is combinable with any of the above embodiments and aspects, the purge chamber is integrally attached to the sump chamber, and the reservoir chamber is integrally attached to the purge chamber.

In another embodiment, a semiconductor device handler comprises at least one thermal unit and the cooling system of any of the above embodiments or aspects, wherein the at least one thermal unit comprises an electric heater that has a first face for making contact with an electronic device, and a second face which is opposite said first face; and a heat sink, coupled to said second face of said heater such that said heater is interposed between said heat sink and said electronic device.

BRIEF DESCRIPTION OF THE DRAWINGS

Embodiments of the invention are described by referring to the attached drawings, in which.

DETAILED DESCRIPTION

In the following description, for purposes of explanation and not limitation, details and descriptions are set forth in order to provide a thorough understanding of embodiments of the present invention. However, it will be apparent to those skilled in the art that the present invention may be practiced in other embodiments that depart from these details and descriptions.

First Embodiment

Figure 1:
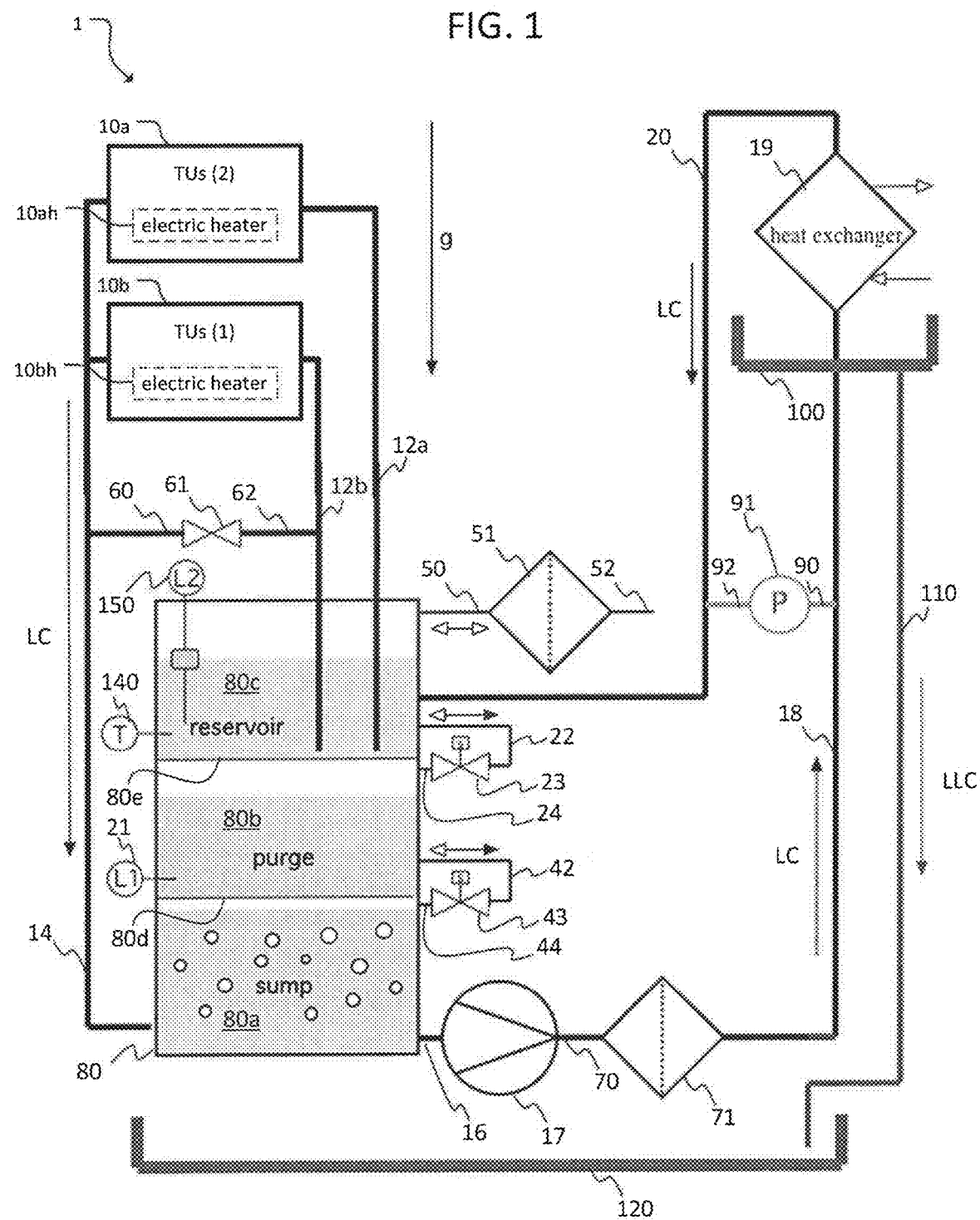
FIG. 1 is a schematic side view of a leak tolerant liquid cooling system for electrical components, according to a first embodiment of invention.
Figure 2:
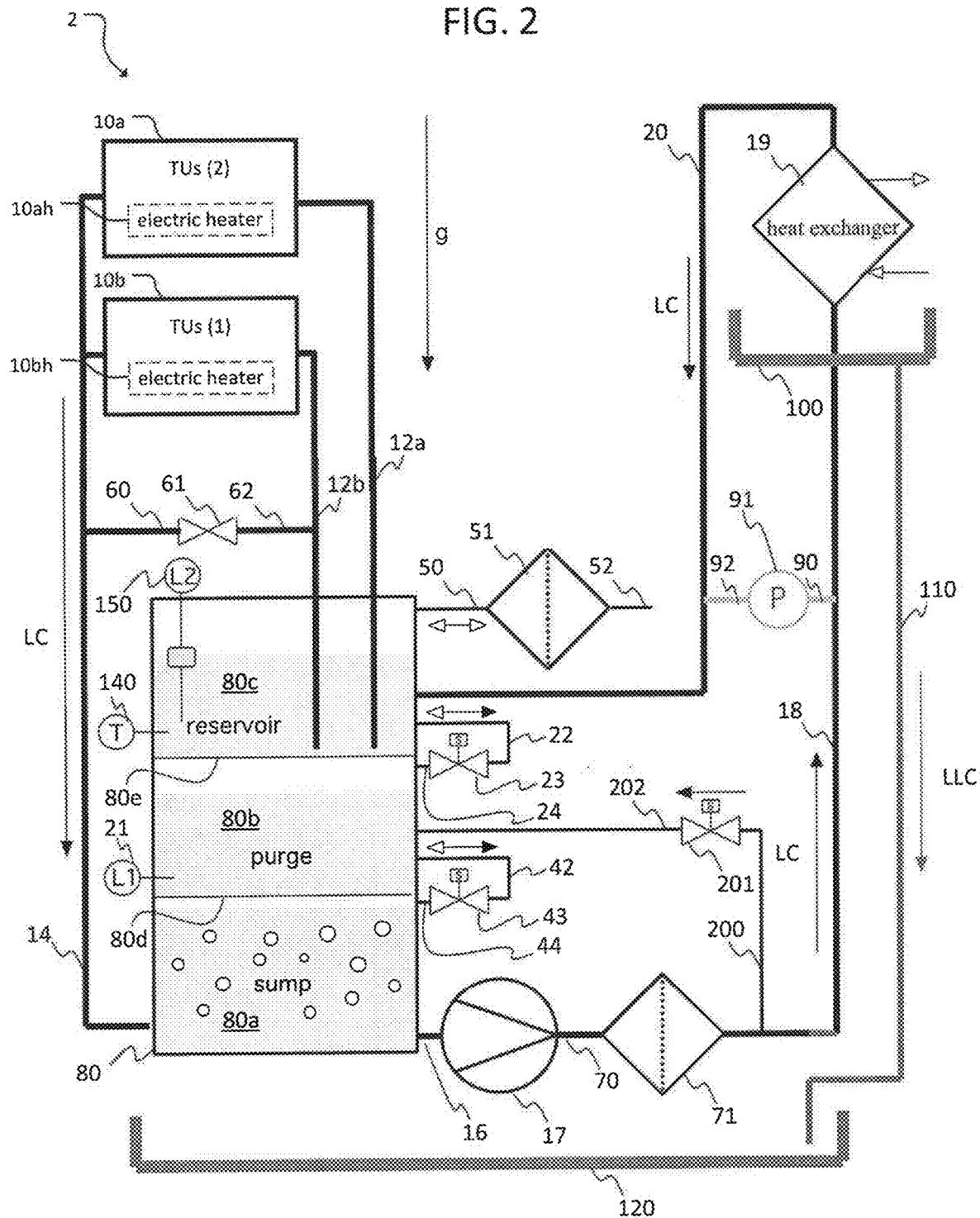
FIG. 2 is a schematic side view of a leak tolerant liquid cooling system for electrical components that includes a "turbopurge" feature, according to a second embodiment of invention.

FIG. 1 is a schematic side view of a leak tolerant liquid cooling system 1 for electrical components, according to a first embodiment of invention. Components are not shown to scale. In FIGS. 1 and 2, black-headed arrows indicate the flow of liquid coolant LC, while white-headed arrows indicate the flow of air. The coolant is, for example, water.

The system 1 of the first embodiment is configured to provide coolant to first and second thermal units 10a and 10b. The thermal units include, for example, an electric heater 10ah, 10bh that has a first face for making contact with an electronic device, and a second face which is opposite said first face; and a heat sink, coupled to said second face of said heater such that said heater is interposed between said heat sink and said electronic device. Such thermal units are described, for example, in U.S. Pat. No. 5,821,505 ("the '505 patent"), which is incorporated herein by reference for its teachings related to temperature control systems. Where the system 1 is configured to provide coolant to a thermal unit, the coolant is provided to the heat sink. The systems described herein are not limited to those configured to provide coolant to thermal units that include a heater and a heat sink. Rather, the systems can be configured to provide liquid coolant to any type of thermal units configured to cool any heat generating electrical components such as high power lamps and transistors. For example, the liquid coolant may simply be circulated past the components via a coolant circuit that includes a cooling jacket that holds the electronic components, in which case the thermal unit is the cooling jacket.

The system 1 includes a tank assembly 80. The tank assembly 80 includes a sump chamber 80a, a purge chamber 80b, and a reservoir chamber 80c. The tank assembly includes a first wall 80d separating the sump chamber 80a and the purge chamber 80b, and a second wall 80e separating the purge chamber 80b and the reservoir chamber 80c. The tank assembly 80 is preferably a unitary assembly in which the sump chamber 80a, the purge chamber 80b, and the reservoir chamber 80c are integrally and permanently attached to one another (for example, by welding or chemical bonding). Preferably the tank assembly 80 is made of a plastic such as PVC, and the chambers are chemically bonded to one another. The first wall 80d and second wall 80e are made of a continuous sheet of material without any valves or openings therethrough. Thus, the sump chamber 80a is, at no point during operation of the system 1, in fluid communication with the purge chamber 80b via any portion of the first wall 80d. Likewise, the purge chamber 80b is, at no point during operation of the system 1, in fluid communication with the reservoir chamber 80c via any portion of the second wall 80e. The reservoir chamber 80c is located above the purge chamber 80b, and the purge chamber 80b is located above the sump chamber 80a.

The reservoir 80c holds coolant LC at atmospheric pressure or above. Components 12a and 12b are conduits that carry the coolant from the reservoir chamber 80c to the thermal units 10a and 10b, respectively. Component 14 is a conduit that carries the coolant from the thermal units 10a and 10b to the sump chamber 80a. The sump chamber 80a receives the coolant from the conduit 14 and sends it through a conduit 16 to an input of a pump 17. Coolant from an output of the pump 17 is sent through a conduit 70 to an input of a filter 71. From filter 71, coolant passes through a conduit 18 to an input of a heat exchanger 19. After being cooled in the heat exchanger 19, the coolant passes back to the reservoir chamber 80c. The circuit that includes the sump chamber 80a, the pump 17, the filter 71, the heat exchanger 19, the reservoir chamber 80c and the thermal units is referred to as the "cooling circuit."

The pump may be, for example, a centrifugal pump, such as the UPS 26-150 SF, available from Barrett Engineered Pumps.

The filter may be, for example, an in-line filter, such as the model 0073610 large in-line filter, available from ITW Filtertek.

The heat exchanger may be, for example, a liquid/air heat exchanger in which a liquid coolant is cooled by a flow of air that is controlled by a fan, or a liquid/liquid heat exchanger, in which the internal coolant fluid of the heat exchanger is cooled by chilled fluid provided by an external source (such as a chilled fluid line in a factory). It is also possible for the heat exchanger to be a heat pump type heat exchanger using refrigeration to cool the internal coolant fluid.

A conduit 44 leads from the sump chamber 80a to a first valve 43. A conduit 42 leads from the first valve 43 to the purge chamber 80b. During normal operation, the first valve 43 is open. Therefore, the sump chamber 80a and the purge chamber 80b are equalized and at negative pressure, due to the action of the pump 17. The first valve 43 is located externally of the tank assembly 80. Therefore, the first valve 43 can be easily repaired and/or replaced even though the tank assembly 80 is a unitary assembly in which the sump chamber 80a, the purge chamber 80b, and the reservoir chamber 80c are preferably integrally and permanently attached to one another.

A conduit 24 leads from the purge chamber 80b to a second valve 23. A conduit 22 leads from the second valve 23 to the reservoir chamber 80c. During normal operation, the second valve 23 is closed. Thus, the reservoir chamber 80c is at atmospheric pressure or higher, due to the action of the pump 17 and an S-bubble airlock 51, described in more detail below. The second valve 23, like the first valve 43, is located externally of the tank assembly 80.

The first and second valves 43 and 23 are electro-mechanical control valves or pneumatic valves that open and close in response to control signals from the sensor 21. Preferably, the valves 43 and 23 default to the open position, and the thermal units 10a, 10b are located above the fluid level of the reservoir chamber 80c. Consequently, when no power is supplied to the system (pump 17 is off and valves 43, 23 are open), the conduits 12a, 12b, 14 and thermal units 10a, 10b are remain at negative pressure due to gravity pulling coolant down from the thermal units 10a, 10b. However, as discussed above, during normal operation of the system 1, the first valve 43 is open, and the second valve 23 is closed.

The conduits 44, 42, 24, 22 and the valves 43, 23 are sized such that, when the valves 43, 23 are open, both coolant and air can simultaneously pass through the conduits 44, 42, 24, 22 and valves 43, 23, coolant in a first direction and air in a second, opposing direction.

A sensor 21 is in communication with the purge chamber 80b. The sensor 21 is configured to determine when the coolant in the purge chamber 80b has dropped to a predetermined level (in other words, when a predetermined volume of air has accumulated in the purge chamber 80b.)

During normal operation of the system 1, no air bubbles are entrained in the liquid coolant. Thus, as the coolant passes through the sump chamber 80a, no air rises to the top of the sump chamber 80a, through the conduit 44, first valve 43, and conduit 42, and to the purge chamber 80b. Consequently, the amount of air in the purge chamber 80b remains fixed.

If a leak develops in a portion of the system that is at negative pressure, for example in the conduits 12a, 12b, 14 or the thermal units 10a, 10b, air is sucked into the leaking component. As discussed above, coolant in the reservoir chamber 80c is at essentially atmospheric pressure, and pressure drops from that reference point occur in the components 10a, 10b, 12a, 12b, 14 as the coolant is sucked through them by the pump 17. Consequently, no coolant is spilled from the components 10a, 10b, 12a, 12b, 14 when a leak develops.

It is also possible for air to accumulate in the cooling circuit even without a leak. For example, air may be absorbed into the coolant in the reservoir chamber 80c and may be released in the sump chamber 80a due to the lower pressure in the sump chamber.

As the coolant with its entrained air passes through the sump chamber 80a, the velocity of the coolant slows down. The sump chamber 80a is sized so that the coolant passes through it with a velocity that is low enough to let any air bubbles that are entrained in the coolant to rise and move by buoyancy through the conduit 44, first valve 43, and conduit 42, and to the purge chamber 80b in a first direction, while coolant passes from the purge chamber 80b through the conduit 42, first valve 43, and conduit 44 to the sump chamber 80a in a second, opposing direction.

As air enters the purge chamber 80b due to buoyancy, a small amount of the liquid coolant in the purge chamber 80b is forced through the conduit 42, first valve 43, and conduit 44 into the sump chamber 80a. This flow of liquid causes the pressure in the two chambers 80a and 80b to remain equalized.

If the leak in components 10a, 10b, 12a, 12b, 14 continues, then the level of the liquid coolant in the purge chamber 80b will eventually drop to a predetermined level that is detected by a probe of the sensor 21. When that occurs, the sensor sends control signals via, for example, conductive wires, to the first valve 43 and the second valve 23, which causes the first valve 43 to close, and causes the second valve 23 to open, initiating an air purge.

When the valve 23 is open, the liquid coolant passes from the reservoir chamber 80c through the valve 23 into the purge chamber 80b in a first direction, due to gravity g. This causes the pressure in the purge chamber 80b to rise, which causes air in the purge chamber 80b to simultaneously flow in a second, opposing direction, from the purge chamber 80b to the reservoir chamber 80c. Excess air in the reservoir chamber 80c flows from the reservoir chamber 80c to an ambient environment via a conduit 50, an S-bubble airlock 51, and a conduit 52, such that the reservoir chamber is returned to atmospheric pressure. The S-bubble airlock 51 seals the reservoir chamber 80c from the outside environment to keep out contaminants and microbes, but allows the reservoir chamber to remain at atmospheric pressure. The S-bubble airlock 51 is located externally of the tank assembly 80. Therefore, the S-bubble airlock 51 can be easily repaired and/or replaced even though the tank assembly 80 is a unitary assembly in which the sump chamber 80a, the purge chamber 80b, and the reservoir chamber 80c are integrally and permanently attached to one another. The S-bubble airlock 51 optionally contains a fluid that includes a biocide and has a low vapor pressure, such as oil.

The first valve 43 remains closed and the second valve 23 remains open for a predetermined amount of time after the air purge is initiated, after which the valves 43 and 23 are returned to their normal operational state (i.e., the first valve 43 is opened, and the second valve 23 is closed). The predetermined amount of time may be between 60 seconds and 180 seconds, and more preferably between 90 seconds and 150 seconds, and more preferably about 120 seconds.

Using the air bubble removal operation described above, the coolant moves through the fluid circuit components with an essentially steady velocity and pressure. Thus, the thermal units 10a, 10b are provided coolant at a constant predetermined rate. In addition, the absence of any pressure transients reduces stress in the fluid circuit components. Further, because the pump 17 is not switched off and on, power surges or voltage transients from the supply (not shown) that powers the pump 17, thermal units 10a, 10b are avoided.

A temperature of the coolant provided to the thermal units 10a, 10b may be controlled in various modes. In a first mode, a fixed pulse-width modulation (PWM) is used to control a cooling fan of the heat exchanger 19 (100% meaning that the fan is always on). In a second mode, the temperature of the coolant provided to the thermal units 10a, 10b is monitored by a temperature sensor, and controlled to a given set point by varying the speed of the heat exchanger fan (with PWM) based on the sensed temperature. In a third mode, a power usage of the heater of the thermal units 10a, 10b is monitored, and the temperature of the coolant provided to the thermal units 10a, 10b is controlled by varying the speed of the heat exchanger fan (with PWM) based on the heater power. For example, the fan speed may be controlled based on the power of a thermal unit having the lowest heater power among the thermal units 10a, 10b.

Optionally, the system 1 includes one or more pressure relief valves 61. A conduit 62 leads from the conduit 12b to the pressure relief valve 61, and a conduit 60 leads from the pressure relief valve 61 to the conduit 14. The pressure relief valve 61 is configured to allow a flow of coolant therethrough when a pressure in the conduit leading to the at least one thermal unit 10a, 10b exceeds a predetermined threshold value. The pressure relief valves 61 are included so that, in the even that conduits 12a, 12b to the thermal units 10a, 10b are disconnected, coolant may flow directly from the conduits 12a, 12b to the conduit 14, thereby relieving pressure in the conduit 14.

The system 1 further includes a temperature sensor 140 configured to measure a temperature of the coolant in the reservoir chamber 80c.

The system 1 further includes a coolant level sensor 150 configured to measure a coolant level in the reservoir chamber 80c, to allow a determination of whether the reservoir chamber 80c contains an adequate amount of coolant.

The system 1 further includes a first drip pan 100 located beneath the heat exchanger 19, and a second drip pan 120 located beneath the tank assembly 80, pump 17, and filter 71. A conduit 110 leads from the drip pan 100 to the drip pan 120, and is configured to allow leaked liquid coolant LLC to flow from the drip pan 100 to the drip pan 120.

The system 1 further includes a differential pressure sensor 91 located between an inlet and an outlet of the heat exchanger 19, to allow measurement of flow through the heat exchanger 19. A conduit 90 leads from the conduit 18 to the differential pressure sensor 91, and a conduit 92 leads from the differential pressure sensor 91 to the conduit 20.

Second Embodiment

FIG. 2 is a schematic side view of a leak tolerant liquid cooling system 2 for electrical components that includes a "turbopurge" feature, according to a second embodiment of invention.

The second embodiment is identical to the first embodiment, except as explicitly stated below. The same reference numerals are used in FIG. 2 for the second embodiment as in FIG. 1 with respect to the first embodiment, where applicable. Component are not shown to scale.

In the second embodiment, the system 2 further includes a conduit 200 leading from the conduit 18 to the a third valve 201, and a conduit 202 leading from the third valve 201 to the purge chamber 80b. During normal operation, the third valve 201 is closed.

The valve 201, like the first and second valves 43 and 23, is an electro-mechanical control valve that opens and closes in response to control signals from the sensor 21. Preferably, the third valve 201, like the first and second valves 43 and 23, defaults to the open position.

As described above with respect to the first embodiment, when the level of the liquid coolant in the purge chamber 80b drops to a predetermined level that is detected by a probe of the sensor 21, the sensor sends control signals via, for example, conductive wires, to the first valve 43 and the second valve 23, which causes the first valve 43 to close, and causes the second valve 23 to open, initiating an air purge. In the second embodiment, the sensor additionally send a control signal via, for example, a conductive wire, to the third valve 201, causing the third valve to open. Thus, the pump forces coolant into the purge chamber 80b via the conduit 200, third valve 201, and conduit 202. This causes the pressure in the purge chamber 80b to rise, which causes air in the purge chamber 80b to flow from the purge chamber 80b to the reservoir chamber 80c. This allows air to be purged from the purge chamber 80b to the reservoir chamber 80c more quickly than can be achieved by gravity pulling coolant into the purge chamber 80b from the reservoir chamber 80c, as in the first embodiment. This is referred to herein as a "turbopurge." As in the first embodiment, excess air in the reservoir chamber 80c flows from the reservoir chamber 80c to an ambient environment via a conduit 50, an S-bubble airlock 51, and a conduit 52, such that the reservoir chamber is returned to atmospheric pressure.

The first valve 43 remains closed and the second and third valves 23, 201 remain open for a predetermined amount of time after the air purge is initiated, after which the valves 43, 23, and 201 are returned to their normal operational state (i.e., the first valve 43 is opened, and the second and third valves 23, 201 are closed). The predetermined amount of time may be between 3 and 20 seconds, preferably between 3 and 10 seconds, and more preferably about 5 seconds.

Other Embodiments

In other embodiments, a semiconductor device handler is provided that includes a leak tolerant liquid cooling system according to the first or second embodiment described above.

A controller may be provided in the system 1 or 2, to control various components of the system. For example, the controller may turn the pump 17 on and off, control the valves 42, 23, 201, receive inputs from the sensors 21, 140, 150, 91, and drive a fan of the heat exchanger 19. The controller may also keep track of the frequency of purge cycles, which provides an indication on the existence and/or extent of leaks in the system. The controller may also keep track of any error conditions in the system.

In the first and second embodiments described above, the valves 43 and 23 default to the open position, and the thermal units 10a, 10b are located above the fluid level of the reservoir chamber 80c. Consequently, when no power is supplied to the system (pump 17 is off and valves 43, 23 are open), the conduits 12a, 12b, 14 and thermal units 10a, 10b are remain at negative pressure due to gravity pulling coolant down from the thermal units 10a, 10b, even though the reservoir chamber 80c is at atmospheric pressure. As an alternative, a vacuum can be maintained in the reservoir chamber 80c. In this embodiment, the thermal units 10a, 10b can be kept at negative pressure even if they are not located above the fluid level of the reservoir chamber 80c.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. The features of the embodiments described herein may be combined in all possible combinations of methods, apparatus, modules, systems, and computer program products.

What is claimed is:

1. A cooling system for at least one thermal unit, the cooling system comprising:
    a tank assembly that includes:
        a sump chamber,
        a purge chamber that is located above the sump chamber, and
        a reservoir chamber that is located above the purge chamber;
    a cooling circuit that includes a pump, a heat exchanger, and conduits, the cooling circuit being configured to circulate a liquid coolant through the at least one thermal unit, the sump chamber, the pump, the heat exchanger, and the reservoir chamber;
    a first valve located externally of the tank assembly and configured such that, when the first valve is open, (i) the liquid coolant is flowable from the purge chamber to the sump chamber via the first valve, and (ii) air is simultaneously flowable from the sump chamber to the purge chamber via the first valve; and
    a second valve located externally of the tank assembly and configured such that, when the second valve is open, (i) the liquid coolant is flowable from the reservoir chamber to the purge chamber via the second valve, and (ii) air is simultaneously flowable from the purge chamber to the reservoir chamber via the second valve,
    wherein the sump chamber and the purge chamber are separated by a first wall, and the sump chamber is at no point during operation of the system in fluid communication with the purge chamber via any portion of the first wall.

2. The cooling system of claim 1,
    wherein the purge chamber and the reservoir chamber are separated by a second wall, and
    wherein the first wall and the second wall are each made of a continuous sheet of material with no valves extending therethrough and no openings extending therethrough.

3. The cooling system of claim 1, wherein the cooling circuit further comprises a filter located at a location in the cooling circuit between the pump and the reservoir chamber.

4. The cooling system of claim 1, wherein, during operation of the system, the first valve is open and the second valve is closed.

5. The cooling system of claim 4, wherein, when no power is supplied to the first and second valves, the first and second valves are open.

6. The cooling system of claim 5, wherein the at least one thermal unit is located above a normal fluid level of the reservoir chamber.

7. The cooling system of claim 4, wherein, during operation of the system, the sump chamber, the purge chamber, and the portion of the cooling circuit at the at least one thermal unit are at negative pressure, while the reservoir chamber is at atmospheric pressure or above.

8. The cooling system of claim 7, wherein the system is configured such that, if a leak develops in the cooling circuit, air that enters the sump chamber slows down and rises through the first valve to the purge chamber, while coolant in the purge chamber simultaneously passes through the first valve to the sump chamber.

9. The cooling system of claim 8, further comprising a sensor in communication with the reservoir chamber and configured to provide an output signal indicating when the coolant in the reservoir chamber has dropped to a predetermined level.

10. The cooling system of claim 9, wherein the system is configured such that, when the output signal indicates that the coolant in the purge chamber has dropped to a predetermined level, the first valve closes and the second valve opens, such that coolant passes from the reservoir chamber through the second valve into the purge chamber, while air simultaneously passes from the purge chamber through the second valve into the reservoir chamber.

11. The cooling system of claim 10, further comprising an S-bubble airlock located externally of the tank assembly and configured to allow the reservoir chamber to remain at atmospheric pressure.

12. The cooling system of claim 11, wherein the S-bubble airlock is configured to seal the reservoir chamber from the outside environment, but allows the reservoir chamber to remain at atmospheric pressure.

13. The cooling system of claim 11, wherein the S-bubble airlock contains a fluid that includes a biocide.

14. The cooling system of claim 10, further comprising a third valve located between (i) a conduit located between the pump and the reservoir chamber and (ii) the purge chamber, wherein the system is configured such that, when the output signal indicates that the coolant in the reservoir chamber has dropped to a predetermined level, the third valve opens, such that coolant is pumped to the purge chamber by the pump.

15. The cooling system of claim 1, wherein a fixed pulse-width modulation (PWM) is used to control a speed of a cooling fan of the heat exchanger.

16. The cooling system of claim 1, wherein a temperature of coolant provided to the at least one thermal unit is monitored by a temperature sensor, and controlled to a given set point by varying a speed of a cooling fan of the heat exchanger based on the sensed temperature.

17. The cooling system of claim 1, wherein a power usage of a heater of the at least one thermal unit is monitored, and a temperature of coolant provided to the at least one thermal is controlled by varying a speed of a cooling fan of the heat exchanger based on the monitored heater power usage.

18. The cooling system of claim 1, further comprising at least one pressure relief valve located between at least one conduit leading to the at least one thermal unit and at least one conduit leading from the at least one thermal unit, in parallel with the at least one thermal unit, the pressure relief valve being configured to allow a flow of coolant therethrough when a pressure in the conduit leading to the at least one thermal unit exceeds a predetermined threshold value.

19. The cooling system of claim 1, further comprising a temperature sensor configured to measure a temperature of coolant in the reservoir chamber.

20. The cooling system of claim 1, further comprising a differential pressure sensor located between a conduit leading to the heat exchanger and a conduit leading from the heat exchanger.

21. The cooling system of claim 1, wherein the purge chamber is integrally attached to the sump chamber, and the reservoir chamber is integrally attached to the purge chamber.

* * * * *